US012747492B2

(12) United States Patent
Wang et al.

(10) Patent No.: US 12,747,492 B2
(45) Date of Patent: Sep. 29, 2026

(54) PHYSICAL VAPOR DEPOSITION SYSTEM AND METHODS OF OPERATING THE SAME

(71) Applicant: Taiwan Semiconductor Manufacturing Company, Ltd., Hsinchu (TW)

(72) Inventors: Chia-Hsi Wang, Hsinchu City (TW); Yen-Yu Chen, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 602 days.

(21) Appl. No.: 18/326,256

(22) Filed: May 31, 2023

(65) Prior Publication Data

US 2024/0271271 A1 Aug. 15, 2024

Related U.S. Application Data

(60) Provisional application No. 63/484,100, filed on Feb. 9, 2023.

(51) Int. Cl.
*C23C 14/34* (2006.01)
*C23C 14/54* (2006.01)
(Continued)

(52) U.S. Cl.
CPC .......... *C23C 14/3492* (2013.01); *C23C 14/54* (2013.01); *C23C 14/588* (2013.01);
(Continued)

(58) Field of Classification Search
CPC ................. C23C 14/3492; C23C 14/54; H01J 2237/24585; H01J 2237/332; H01L 21/2855
See application file for complete search history.

(56) References Cited

U.S. PATENT DOCUMENTS 5,478,455 A * 12/1995 Actor ...................... C23C 14/34 204/298.11
2004/0180541 A1 9/2004 Joshi
(Continued)

FOREIGN PATENT DOCUMENTS

CN 1104262 A 6/1995
DE 10 2020 128 802 A1 5/2022
(Continued)

OTHER PUBLICATIONS

Office Action issued in connection with Taiwan Appl. No. 112128137 dated Jan. 15, 2025.
(Continued)

*Primary Examiner* — Jaehwan Oh
(74) *Attorney, Agent, or Firm* — Foley & Lardner LLP

(57) ABSTRACT

A method for fabricating semiconductor devices is disclosed. The method includes introducing a target in a chamber of a physical vapor deposition (PVD) system. The method includes depositing, on a substrate, a first portion of a film based on a first compensation function, a first value of the first compensation function being determined according to a lifetime of the target. The method includes depositing, on the first portion of the film, a second portion of the film based on a second compensation function, a second value of the second compensation function being determined according to the lifetime of the target. The first value is different from the second value.

20 Claims, 7 Drawing Sheets

(51) Int. Cl.

| | |
|---|---|
| ***C23C 14/58*** | (2006.01) |
| ***H01J 37/34*** | (2006.01) |
| ***H10P 14/44*** | (2026.01) |
| ***H10P 52/40*** | (2026.01) |

(52) U.S. Cl.

CPC .......... *H01J 37/3435* (2013.01); *H10P 14/44* (2026.01); *H10P 52/403* (2026.01); *H01J 2237/24585* (2013.01); *H01J 2237/332* (2013.01)

(56) References Cited

U.S. PATENT DOCUMENTS

2004/0200049 A1 10/2004 Rich et al.
2015/0252467 A1* 9/2015 Allen .................. C23C 14/3492 204/192.12
2015/0371847 A1* 12/2015 Cheng ..................... C23C 14/34 204/192.25
2022/0384188 A1* 12/2022 Venkatasubramanian .................. H01J 37/32816
2023/0026807 A1* 1/2023 Hirata ................. H01J 37/3479

FOREIGN PATENT DOCUMENTS

| | | | |
|---|---|---|---|
| JP | H07-283281 | A | 10/1995 |
| KR | 10-2010-0051810 | A | 5/2010 |
| KR | 10-2022-0092963 | A | 7/2022 |
| WO | WO-2020/238594 | A1 | 12/2020 |

OTHER PUBLICATIONS

Office Action issued in Korean Appl. No. 10-2024-0018822 dated Oct. 22, 2025.
Office Action issued in German Appl. No. 102024100208.5 dated Feb. 26, 2026.
Office Action issued in Chinese Appl. No. 202410177448.4 dated May 21, 2026.

* cited by examiner

PHYSICAL VAPOR DEPOSITION SYSTEM AND METHODS OF OPERATING THE SAME

CROSS-REFERENCE TO RELATED APPLICATION

This application claims priority to and the benefit of U.S. Provisional Application No. 63/484,100, filed Feb. 9, 2023, entitled "THE NOVEL PVD (PHYSICAL VAPOR DEPOSITION) COMPOSITE FILM QUALITY CONTROL," which is incorporated herein by reference in its entirety for all purposes.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area.

While some integrated device manufacturers (IDMs) design and manufacture integrated circuits (IC) themselves, fabless semiconductor companies outsource semiconductor fabrication to semiconductor fabrication plants or foundries. Semiconductor fabrication consists of a series of processes in which a device structure is manufactured by applying a series of layers onto a substrate. This involves the deposition and removal of various thin film layers. The areas of the thin film that are to be deposited or removed are controlled through photolithography. Each deposition and removal process is generally followed by cleaning as well as inspection steps. Therefore, both IDMs and foundries rely on numerous semiconductor equipment and semiconductor fabrication materials, often provided by vendors. There is always a need for customizing or improving those semiconductor equipment and semiconductor fabrication materials, which results in more flexibility, reliability, and cost-effectiveness.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
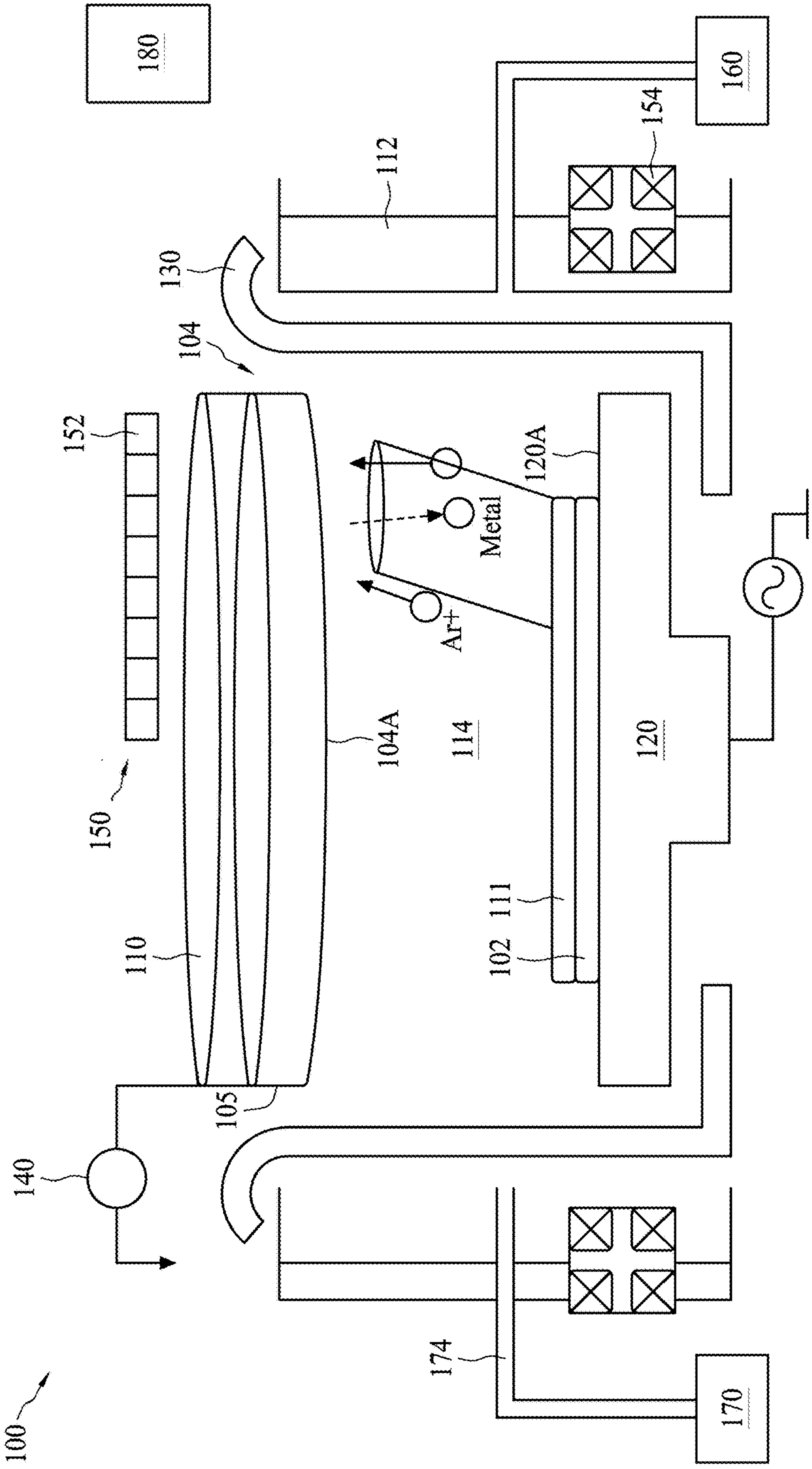
FIG. 1 illustrates a schematic view of a PVD system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Physical vapor deposition (PVD) is a common process for depositing a film of material on a substrate and is commonly used in semiconductor fabrication. The PVD process is carried out at a high vacuum in a chamber containing a substrate (e.g., a wafer) and a solid source or slab of the material (i.e., a "PVD target" or a "target") to be deposited on the substrate. In the PVD process, the PVD target is physically converted from a solid (phase) into a vapor (phase). The vapor of the target material is transported from the PVD target to the substrate, where it is condensed on the substrate as a film (again in the solid phase).

There are many methods for accomplishing PVD, including evaporation, e-beam evaporation, plasma spray deposition, and sputtering. Among those methods, in general, sputtering is the most frequently used method for accomplishing PVD. During sputtering, gas plasma is created in the chamber and directed to the PVD target. The plasma physically dislodges or erodes (sputters) atoms or molecules from the reaction surface of the PVD target into a vapor of the target material, as a result of a collision with high-energy particles (ions) of the plasma. The vapor of sputtered atoms or molecules of the target material is transported to the substrate through a region of reduced pressure and condenses on the substrate, forming the film of the target material.

In general, while using the existing PVD systems to form a film, only a total thickness of the film is examined as a figure of merit (FOM) for determining a quality of the film, regardless of how many portions the film has. This may lead to a poor quality of the formed film. For example, when a film formed by the existing PVD system includes two portions, even though the first formed portion is formed thinner, the second formed portion can be formed thicker to compensate the "thinned" first thickness. However, the second portion, which is commonly formed with a higher substrate temperature (a real temperature measured from the substrate), may have a substantially larger grain size than the first portion, which is commonly formed with a lower substrate temperature. Such a larger grain size may potentially form one or more defects, which can disadvantageously deteriorate the quality of the film. Further, with such a thicker second (upper) portion overlaying a thinner (lower) portion, even applying a polishing process after the PVD process, the second portion may remain, leaving the defects still present on a top surface of the formed film. Thus, the existing PVD systems and/or methods for operating the same have not been entirely satisfactory in certain aspects.

Some embodiments of the present disclosure are described as follows. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

The present disclosure provides various embodiments of a method for manufacturing semiconductor devices, in particular, a method for depositing a film including a first portion and a second portion using a physical vapor deposition (PVD) system. In various embodiments, the methods, as disclosed herein, can individually control a first thickness of the first portion and a second thickness of the second portion. For example, the first thickness is controlled based on a first compensation function of a target lifetime and the second thickness is controlled based on a second compensation function of the target lifetime (independent from the first compensation function). The first compensation function and second compensation function can be empirically determined through a substantial large number of lifetime values, respectively, which allows the first thickness and the second thickness each to remain substantially constant over a wide range of the lifetime values. As such, regardless of how much the lifetime of a target is, the first thickness and the second thickness can be accurately controlled. Further, by accurately controlling the first thickness and the second thickness, a subsequent polishing process can also be accurately controlled to expose the first portion, which typically has a smaller grain size. In this way, a film formed by the disclosed method can have a significantly lower amount of defects, when compared to a film formed by other PVD systems that are not operated by the disclosed method.

FIG. 1 is a schematic view of a PVD system 100, in accordance with some embodiments of the present disclosure. The PVD system 100 can be configured to form (e.g., deposit) one or more materials (e.g., as a film) onto a substrate. An example material includes a metallic material such as, for example, titanium, titanium nitride, tantalum, tantalum nitride, aluminum, titanium aluminide (gamma titanium). Other example materials include carbides, silicides, and borides for certain applications. According to various embodiments of the present disclosure, the formed film can include two or more portions, each of which has a thickness that can be individually controlled. Alternatively stated, none of the portions of the film needs to compensate for an unintentionally compromised (e.g., thinned) thickness of any other portion of the film.

As shown, a substrate 102, onto which a film 111 is formed, is placed on a substrate support 120 of a chamber body 112. During the PVD process, a PVD target 104 is bombarded by energetic ions, such as a plasma, causing material to be knocked off the target and deposited as the film 111 on the substrate 102. In some embodiments, the PVD system 100 may be a magnetron PVD system, in which the chamber body 112 encloses a processing region or a plasma zone 114. The substrate support 120 has a substrate receiving surface 120A that receives and supports the substrate 102 during the PVD process, so that a surface of the substrate 102 is opposite to a (e.g., front) surface of the PVD target 104 that is exposed to the processing region 114. The substrate support 120 is electrically conductive and is coupled to ground (GND) so as to define an electrical field between the PVD target 104 and the substrate 102. In some embodiments, the substrate support 120 is composed of aluminum, stainless steel, or ceramic material. In some embodiments, the substrate support 120 is an electrostatic chuck that includes a dielectric material.

A shield 130, also referred to as a dark space shield, is positioned inside the PVD chamber body 112 and proximate sidewalls 105 of the PVD target 104 to protect inner surfaces of the chamber body 112 and sidewall (i.e., target sidewall 105) of the PVD target 104 from unwanted deposition. The shield 130 can be positioned very close to the target sidewall 105 to minimize re-sputtered material from being deposited thereon. The shield 130 has a plurality of apertures (not shown) defined therethrough for admitting a plasma-forming gas such as argon (Ar) from the exterior of the shield 130 into its interior.

A power supply 140 is electrically coupled to a backing plate 110 of the PVD target 104. The power supply 140 is configured to negatively bias the PVD target 104 with respect to the chamber body 112 to excite a plasma-forming gas, for example, argon, into a plasma. In some embodiments, the power supply 140 is a direct current (DC) power supply source. In other embodiments, the power supply 140 is a radio frequency (RF) power supply source.

A magnet assembly 150 is disposed above the PVD target 104. The magnet assembly 150 is configured to project a magnetic field parallel to a front surface 104A of the PVD target 104 to trap electrons, thereby increasing the density of the plasma and increasing the sputtering rate. In some embodiments, the magnet assembly 150 is configured to scan about the back of the PVD target 104 to improve the uniformity of deposition. In some embodiments, the magnet assembly 150 includes a single magnet disposed above the PVD target 104 (not shown). In some embodiments, the magnet assembly 150 includes an array of magnets. In some embodiments and as shown in FIG. 1, the magnet assembly 150 includes one or more magnets 152 disposed above the PVD target 104. In some embodiments, the magnet(s) 152 may spin during the deposition. In some embodiments, the magnet assembly 150 also includes a side electromagnet 154 around the chamber body 112.

A gas source 160 is in fluidic combination with the chamber body 112 via a gas supply pipe. The gas source 160 is configured to supply a plasma-forming gas to the processing region 114 via the gas supply pipe. The plasm-forming gas includes an inert gas and does not react with the materials in the PVD target 104. In some embodiments, the plasma-forming gas includes argon, xenon, neon, or helium, which is capable of energetically impinging upon and sputtering source material and the dopant from the PVD target 104. In some embodiments, the gas source 160 is also configured to supply a reactive gas into the PVD system 100. The reactive gas includes one or more of an oxygen-containing gas, a nitrogen-containing gas, a methane-containing gas, that is capable of reacting with the sputtering source material in the PVD target 104 to form the film 111 on the substrate 102.

A vacuum device 170 is in fluidic communication with the PVD system 100 via an exhaust pipe 174. The vacuum device 170 is used to create a vacuum environment in the PVD system 100 during the PVD process. In some embodiments, the PVD system 100 has a pressure in a range from about 1 mtorr to about 10 torr. The spent process gases and byproducts are exhausted from the PVD system 100 through the exhaust pipe 174.

According to various embodiments of the present disclosure, the PVD system 100 further includes or is operatively coupled to a controller 180. The controller 180 is configured to adjust a variety of parameters associated with the PVD processes for depositing the film 111 on the substrate 102. Although not illustrated, it should be appreciated that the controller 180 can be operatively coupled to each of the above-described components of the PVD system 100. By adjusting the parameters, a thickness of each of different portions of the deposited film 111 can be individually controlled. For example, the controller 180 can individually configure, identify, or adjust a substrate temperature, a process time, a magnetic field, an operation voltage, etc., for the PVD process of each of the different portions. Further, the controller 180 can control the respective thicknesses of the different portions to be independent of a lifetime of the PVD target 104, by determining respectively different compensation functions.

Figure 2:
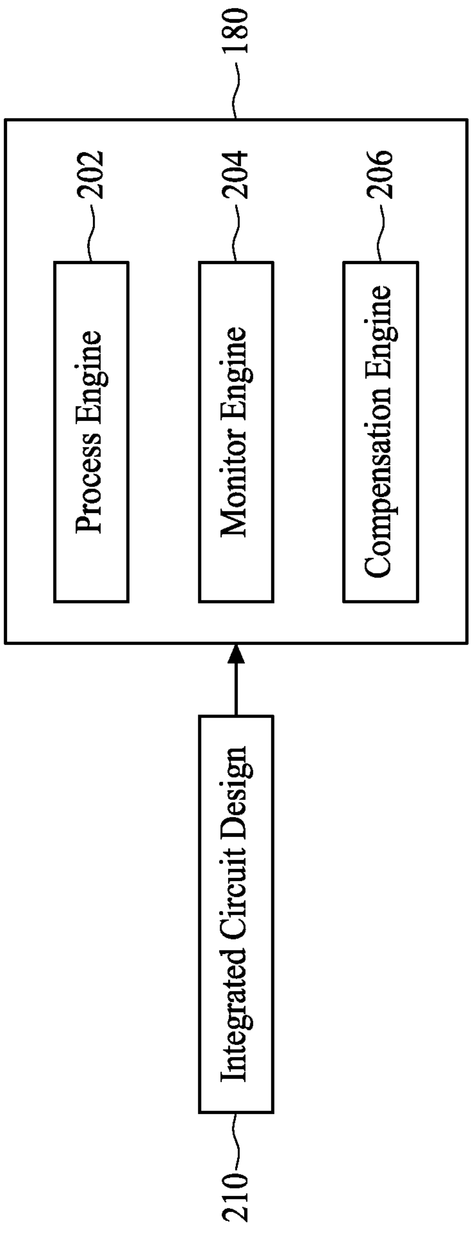
FIG. 2 illustrates a block diagram of a controller of the PVD system, in accordance with some embodiments.

FIG. 2 illustrates an example block diagram of the controller 180, in accordance with some embodiments of the present disclosure. In brief overview, the controller 180 can include a process engine 202, a monitor engine 204, and a compensation engine 206. In some embodiments, the controller 180 can receive an integrated circuit (IC) design 210 to operate the PVD system 100 to deposit a film on a substrate.

Each of the above-mentioned elements or components is implemented in hardware, or a combination of hardware and software, in one or more embodiments. For instance, each of these elements or components can include any application, program, library, script, task, service, process or any type and form of executable instructions executing on a computing device (e.g., work station, or server of a cloud computing platform). The hardware includes circuitry such as one or more processors in one or more embodiments.

An IC design can include a number of electronic components (e.g., semiconductor-based) built into an electrical network in a circuit representation. The electronic components can include circuit cells such as one or more types of logic gates (e.g., physical devices each implementing a Boolean function, or performing a logical operation on one or more binary inputs to produce a binary output), such as AND, OR, NOR, buffer, inverter, XOR, OR-AND-Invert gates. The electronic components can include logic circuits, logic gates or logic devices such as flip-flops, multiplexers, registers, arithmetic logic units (ALUs), and computer memory. The electronic components can include or incorporate the use of transistors, such as field-effect transistors (FETs).

As used herein, the IC design 210 can include at least one of a material or dimension of one or more conductive structures/features included in one of the electronic components or connecting the different electronic components. As a non-limiting example, the IC design 210 may specify the material and the thickness of a seed layer for an interconnect structure connecting multiple electronic components. In another non-limiting example, the IC design 210 may specify the material and the thickness of a bonding pad connecting multiple semiconductor dies. In yet another non-limiting example, the IC design 210 may specify the material and the thickness of a liner for an interconnect structure connecting multiple electronic components. In yet another non-limiting example, the IC design 210 may specify the material and the thickness of a barrier layer for an interconnect structure connecting multiple electronic components.

Upon receiving the IC design 210 (which may specify, e.g., the thickness of a film), the controller 180 can configure various first process parameters for a first PVD process to form a first portion of the film, and various second process parameters for a second PVD process to form a second portion of the film. The second portion is formed over the first portion. The second portion may be later polished out (i.e., exposing a surface of the first portion), in some embodiments. For example, in response to identifying the total thickness of a film, the process engine 202 can determine a process (or chamber) temperature for both the first PVD process and second PVD process, and determine process times, magnetic fields (e.g., provided by the magnet assembly 150), and operation voltages (e.g., provided by the power supply 140) for the first PVD process and second PVD process, respectively. Such initial parameters can be utilized to determine a first target thickness of the first portion and a second target thickness of the second portion, respectively. In some embodiments, a first formed thickness of the first portion can be controlled to be about equal to or slightly thicker than the total thickness of the film. As such, the second portion may serve as a buffer layer for the later performed polishing process.

Further, the monitor engine 204 can monitor various real-time process conditions of the PVD system 100, report back to the process engine 202, and cause the first PVD process and the second PVD process to be initiated accordingly. For example, the monitor engine 204 can operatively communicate with one or more sensors (or otherwise detectors) placed in the chamber body 112 that are configured to measure a real-time temperature of the substrate 102 (substrate temperature). Such sensors are not shown for clarity purposes, and further, one or more of such sensors can be configured to measure other real-time conditions associated with the PVD process occurred in the PVD system 100, for example, a formed thickness of each portion of the film 111, a pressure inside the chamber 112, etc. Once the monitor engine 204 identifies that the substrate temperature satisfies a first condition, the process engine 202 may initiate the first PVD process (using the above-described first process parameters); and once the monitor engine 204 identifies that the substrate temperature satisfies a second condition, the process engine 202 may initiate the second PVD process (using the above-described second process parameters).

For example, the controller 180 may initiate the first PVD process upon identifying the substrate temperature satisfies a first condition (e.g., reaching about 200° C.). Following the first PVD process, the controller 180 may initiate the second PVD process upon identifying the substrate temperature satisfies a second condition (e.g., reaching about 250° C.). Accordingly, the first PVD process and second PVD process are sometimes referred to as "cold deposition" and "hot deposition," respectively. Generally, the cold deposition can form the film (e.g., an aluminum film) in a smaller grain size (e.g., about 0.8~1 μm), while the hot deposition tends to form the film in a bigger grain size (e.g., about 1~1.2 μm). For certain applications, the grain with a size greater than 1 μm may be selected as a defect. In some embodiments, the first PVD process and second PVD process may be performed continuously (i.e., without a time gap configured between the first and second PVD processes). In some other embodiments, the first PVD process and second PVD process may be performed separately (i.e., with a time gap configured between the first and second PVD processes).

Still further, the monitor engine 204 can monitor a (service) lifetime of the PVD target 104, report back to the compensation engine 206, and cause the first PVD process and the second PVD process to be adjusted accordingly. The lifetime can be determined by tracking an accumulated amount of energy, e.g., the number of kilowatt-hours (kw-hrs), consumed by the PVD system 100. In some embodiments, once a value of the lifetime is determined, the compensation engine 206 can determine a first compensation value and a second compensation value for the first PVD process and second PVD process, respectively. The first compensation value is determined according to a first compensation function of the lifetime, and the second compensation value is determined according to a second compensation function of the lifetime. The compensation engine 206 can thus determine a first formed thickness of the first portion according to a first thickness function that is derived based on the first compensation value and the first target thickness, and a second formed thickness of the second portion according to a second thickness function that is derived based on the second compensation value and the second target thickness. Accordingly, the process engine 202 can adjust one or more of the first process parameters for the first PVD process based on the determined first formed thickness, and adjust one or more of the second process parameters for the second PVD process based on the determined second formed thickness.

In various embodiments, the compensation engine 206 can determine the first compensation function ($Z_1$) and the second compensation function ($Z_2$), which are expressed as follows:

$Z_1=ax^2+bx+c$, where "a," "b," and "c" are each an empirical parameter, and "x" corresponds to the lifetime of the target; and $Z_2=dx^2+ex+f$, where "d," "e," and "f" are each an empirical parameter, and "x" corresponds to the lifetime of the target.

Figure 4:
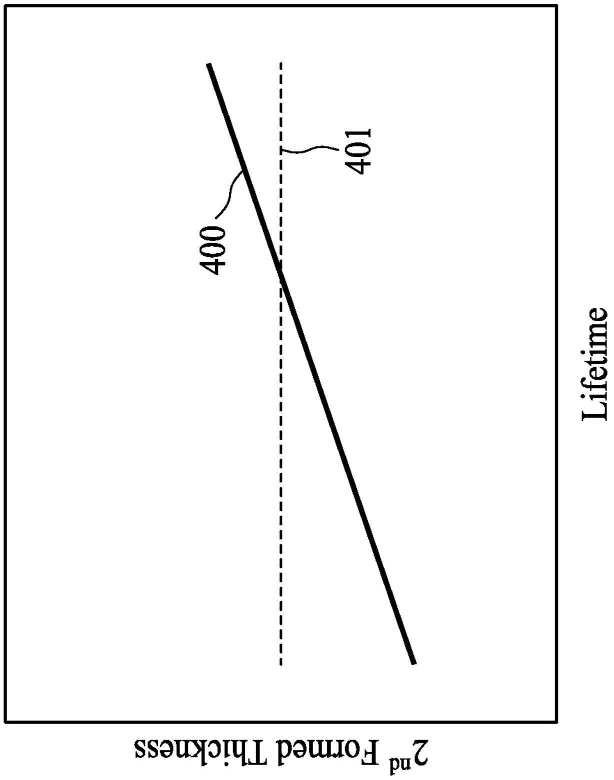
FIG. 4 illustrates a plot of a second formed thickness of a second portion of a film versus a lifetime of a PVD target, in accordance with some embodiments.
Figure 3:
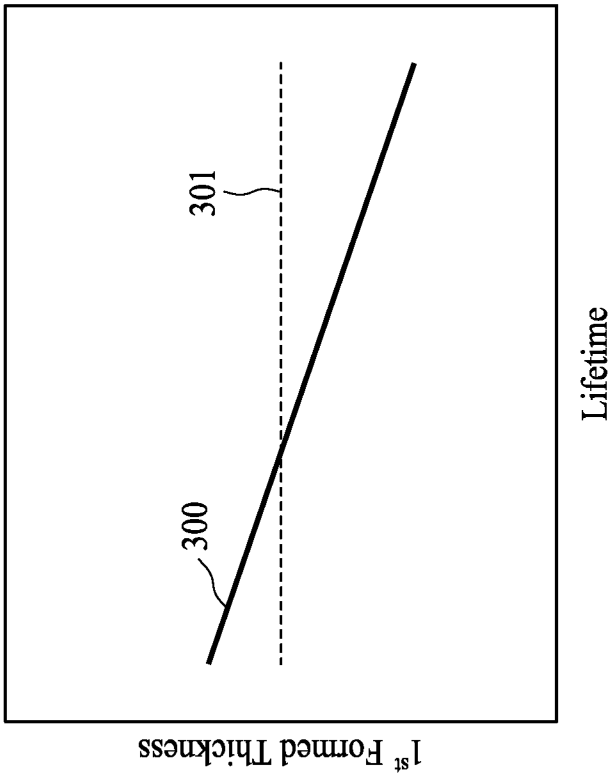
FIG. 3 illustrates a plot of a first formed thickness of a first portion of a film versus a lifetime of a PVD target, in accordance with some embodiments.

The compensation engine 206 can determine the parameters (a, b, c) and (d, e, f) for the first compensation function and second compensation function, respectively, based on a plural number of empirical data points associated with the PVD system 100. For example in FIG. 3, a plot 300 of a plural number of values of previous first formed thickness (through the first PVD process) versus a plural number of values of the lifetime over time is provided (e.g., by the monitor engine 202); and in FIG. 4, a plot 400 of a plural number of values of previous second formed thickness (through the second PVD process) versus a plural number of values of the lifetime over time is provided (e.g., by the monitor engine 202). The plot 300 shows that the previous first formed thickness decreases with the increasing lifetime; and the plot 400 shows that the previous second formed thickness increases with the increasing lifetime.

Figure 5:
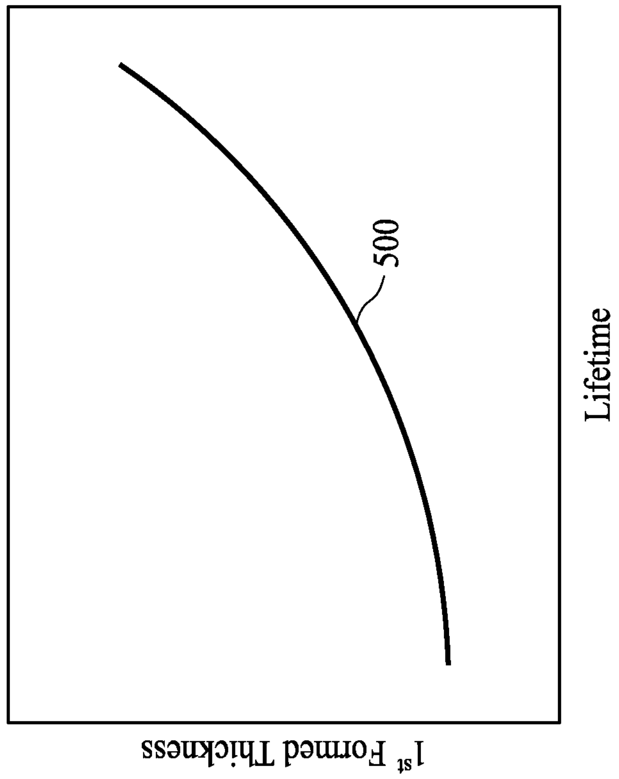
FIG. 5 illustrates a plot of a first delta associated with a first portion of a film versus a lifetime of a PVD target, in accordance with some embodiments.
Figure 6:
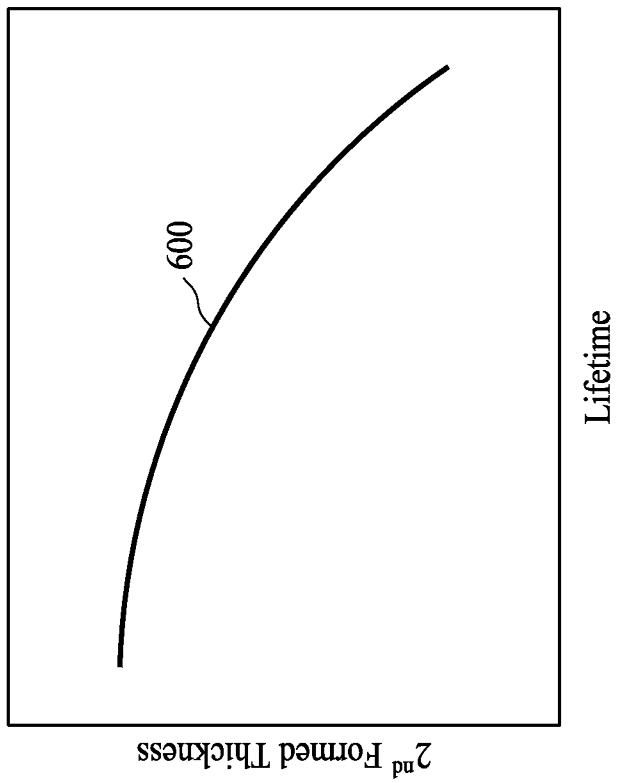
FIG. 6 illustrates a plot of a second delta associated with a second portion of a film versus a lifetime of a PVD target, in accordance with some embodiments.

Next, the compensation engine 206 can calculate a difference (or delta) between the first target thickness (301) and each of the plural first formed thicknesses, and derive a plot 500 of the plural differences versus the plural lifetimes, as shown in FIG. 5; and calculate a difference (or delta) between the second target thickness (401) and each of the plural second formed thicknesses, and derive a plot 600 of the plural differences versus the plural lifetimes, as shown in FIG. 6. The compensation engine 206 can determine respective values of the parameters a, b, and c to fit the plot 500 by any of various fitting techniques; and determine respective values of the parameters d, e, and f to fit the plot 600 by any of various fitting techniques.

Figure 8:
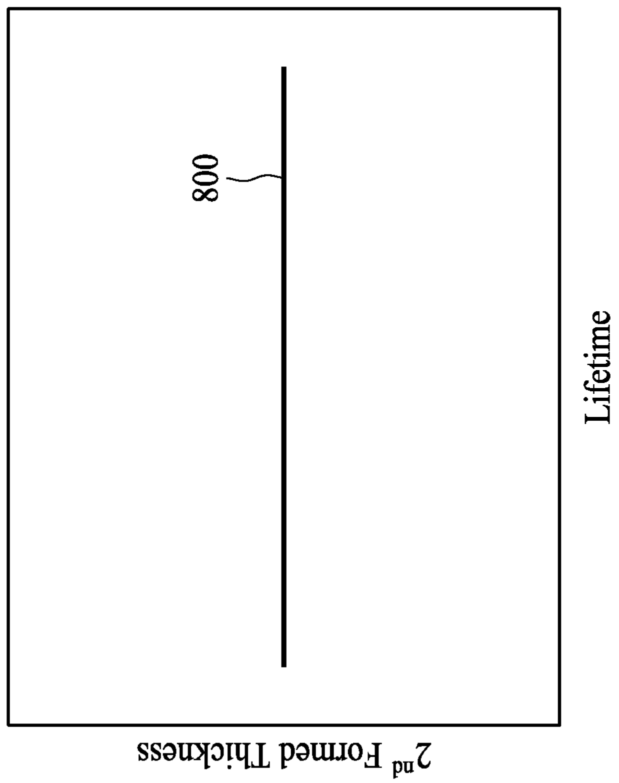
FIG. 8 illustrates a plot of a second compensated thickness of a second portion of a film versus a lifetime of a PVD target, in accordance with some embodiments.
Figure 7:
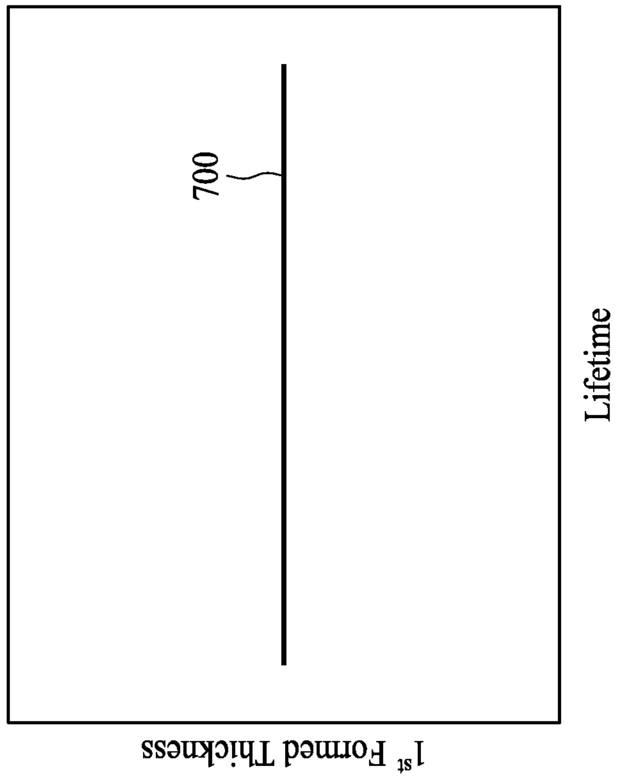
FIG. 7 illustrates a plot of a first compensated thickness of a first portion of a film versus a lifetime of a PVD target, in accordance with some embodiments.

After determining the values of the parameters a, b, c, d, e, and f, the compensation engine 206 can estimate a first formed (or compensated) thickness of the first portion to be formed by the first PVD process and a second formed (or compensated) thickness of the second portion to be formed by the second PVD process, according to the first thickness function ($T_1$) and the second thickness function ($T_2$), respectively. The first thickness function ($T_1$) and the second thickness function ($T_2$) are expressed as follows:

$T_1=A(1+Z_1)$, where "A" corresponds to the first target thickness of the first portion (301); and $T_2=B(1+Z_2)$, where "B" corresponds to the second target thickness of the second portion (401). With the first and second compensation functions incorporated into the first and second thickness functions, respectively, the first formed thickness and second formed thickness can be "flattened" as a constant value independent of different values of the lifetime. Such substantially flat first and second formed thicknesses are shown in plot 700 of FIG. 7 and plot 800 of FIG. 8, respectively.

Upon the compensation engine 206 estimating the first formed thickness and the second formed thickness, the process engine 202 can adjust one or more of the first initial process parameters (for the first PVD process), and adjust one or more of the second initial process parameters (for the second PVD process), in accordance with various embodiments of the present disclosure. For example, prior to, concurrently with, or subsequently to the first PVD process being initiated, the process engine 202 may shorten the process time, decrease the magnetic field, and/or decrease the operation voltage of the first PVD process initially set up according to the IC design 210, in response to the monitor engine 204 identifying that an actual formed thickness of the first portion of the film has reached the estimated first formed thickness. The second PVD process can thus be initiated earlier. In another example, prior to, concurrently with, or subsequently to the first PVD process being initiated, the process engine 202 may lengthen the process time, increase the magnetic field, and/or increase the operation voltage of the first PVD process initially set up according to the IC design 210, in response to the monitor engine 204 identifying that an actual formed thickness of the first portion of the film has not reached the estimated first formed thickness. The second PVD process may thus be pushed back.

Figure 9:
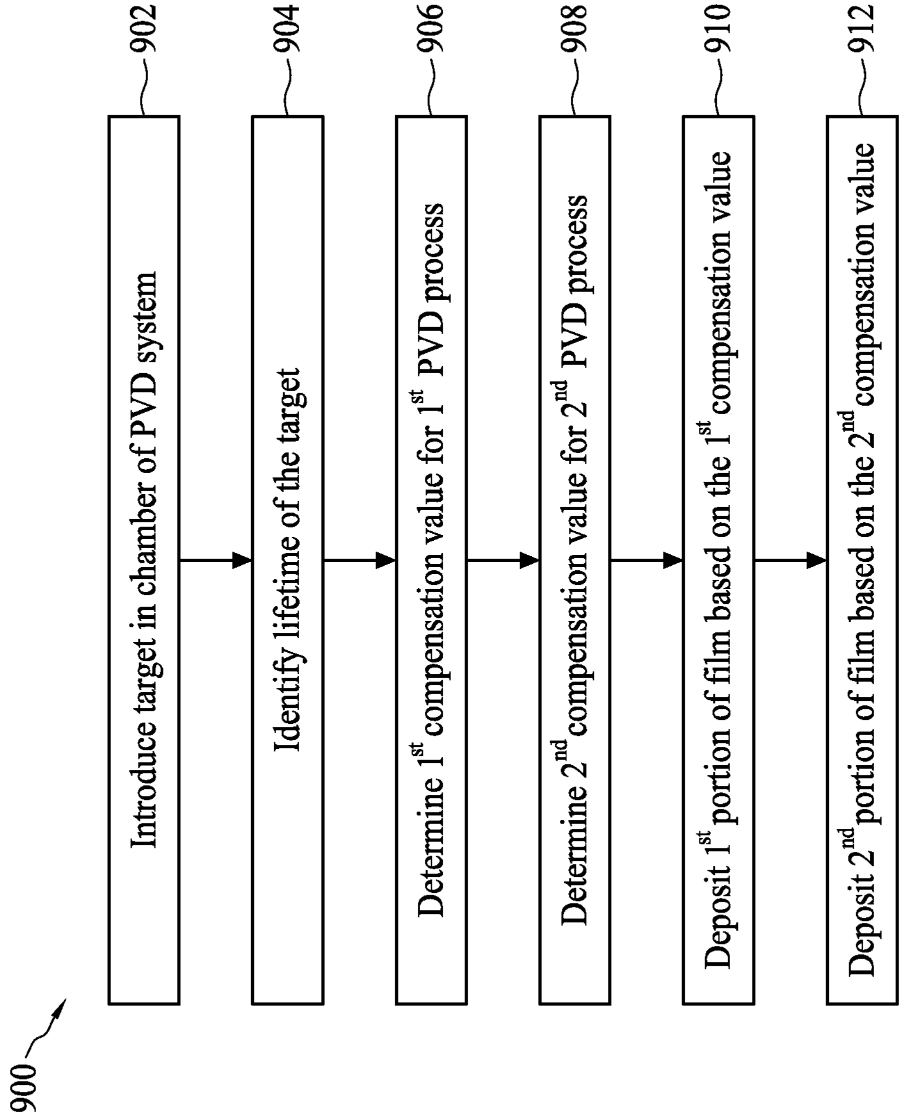
FIG. 9 is an example flow chart of a method for operating the PVD system of FIG. 1, in accordance with some embodiments.

FIG. 9 illustrates a flow chart of an example method 900 to operate a PVD system, in accordance with various embodiments of the present disclosure. The method 900 may be used to operate the disclosed PVD system 100 (FIG. 1), and thus, the following discussion of the method 900 will sometimes refer to the components discussed in FIGS. 1-8. It is noted that the method 900 is merely an example and is not intended to limit the present disclosure. Accordingly, it is understood that additional operations may be provided before, during, and after the method 900 of FIG. 9, and that some other operations may only be briefly described herein.

In brief overview, at least some of the operations described in the method 900 can form a film including two or more portions, and a thickness of each of the portions can be individually controlled. Further, the thickness of each of the portions can be controlled to be independent of the lifetime of a corresponding PVD target based on a respective compensation value. Such compensation values are determined according to respectively different compensation functions of the lifetime of the PVD target.

The method 900 starts with operation 902 in which a target is introduced in a chamber of a PVD system, in accordance with various embodiments. For example in FIG. 1, prior to performing any PVD process, the target 104 is introduced in the chamber 112 of the PVD system 100. The target 104 may be composed of any suitable and appropriate source material including, for example, nickel (Ni), nickel platinum (Ni Pt) alloys, nickel titanium (Ni Ti) alloys, cobalt (Co), aluminum (Al), copper (Cu), titanium (Ti), tantalum (Ta), tungsten (W), indium tin oxide (ITO), zinc sulfide-silicon dioxide ($ZnS'SiO_2$), gold (Au), silver (Ag), and other noble metals. In general, the target 104 is placed with a top surface (e.g., 104A) facing a substrate (e.g., 102) onto which a film (e.g., 111) is to be deposited.

The method 900 proceeds to operation 904 in which a lifetime of the target is identified, in accordance with various embodiments. In some embodiments, the controller 180 (or its monitor engine 204) can identify the lifetime of the target. For example, the controller 180 can track an accumulated amount of energy, e.g., the number of kilowatt-hours (kw-hrs), consumed by the PVD system 100. In another example, the controller 180 can operatively communicate with (or monitor) a plurality of filaments suspended in respective tubes, so as to identify the lifetime of the target 104. The plural tubes, formed of the same material as the target 104, may be placed at different heights of the target 104. For example, a first one of the tubes may be placed around the top surface 104A and a last one of the tubes may be placed around a bottom surface of the target 104 (i.e., the surface opposite to the top surface 104A), with one or more other tubes placed between the first and last tubes. The electrical resistance or impedance of each of the filaments may be monitored by the controller 180 to identify the lifetime of the target 104.

Specifically, at the beginning of the target's lifetime, the electrical resistance or impedance of the filament in first tube (hereinafter "first filament") may be measured at some initial value. As the target 104 erodes during the PVD process(es), the electrical resistance or impedance of the first filament may remain at the initial value until the first tube is breached to expose the first filament suspended in the first tube to the PVD process, thus allowing the plasma (in the case of sputtering) to contact and erode the first filament. When this occurs, the electrical resistance or impedance may change (e.g., decrease) from the initial value, thereby indicating that the lifetime of the target 104 has changed by a (e.g., discrete) level. Following the same principle, the lifetime of the target 104 may be "updated" once a next filament is exposed (and eroded).

The operation 900 proceeds to operation 906 in which a first compensation value is determined for a first PVD process, in accordance with various embodiments. In some embodiments, the controller 180 (or its compensation engine 206) can determine a first compensation value according to a first compensation function (e.g., $Z_1$). The controller 180 can determine the first compensation function based on fitting a number of empirical data points, e.g., a number of first formed thicknesses versus respective lifetimes. In some embodiments, the first compensation function may be a quadratic equation, with the lifetime as an unknown parameter. However, it should be understood that the first compensation function can be an equation with any of various other degree, while remaining within the scope of the present disclosure. The controller 180 can determine the first compensation value by inputting a currently monitored lifetime of the target into the first compensation function.

The operation 900 proceeds to operation 908 in which a second compensation value is determined for a second PVD process, in accordance with various embodiments. In some embodiments, the controller 180 (or its compensation engine 206) can determine a second compensation value according to a second compensation function (e.g., $Z_2$). The controller 180 can determine the second compensation function based on fitting a number of empirical data points, e.g., a number of second formed thicknesses versus respective lifetimes. In some embodiments, the second compensation function may be a quadratic equation, with the lifetime as an unknown parameter. However, it should be understood that the second compensation function can be an equation with any of various other degree, while remaining within the scope of the present disclosure. The controller 180 can determine the second compensation value by inputting a currently monitored lifetime of the target into the second compensation function.

Figure 10:
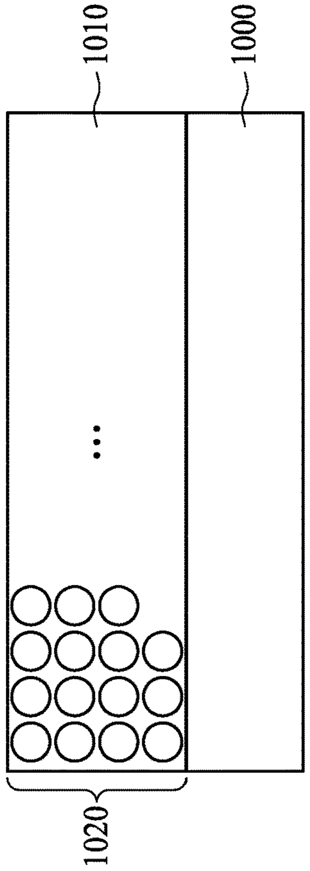
FIG. 10 illustrates a cross-sectional view of a portion of an example semiconductor device having a first portion of a film formed by the PVD system of FIG. 1, in accordance with some embodiments.

The operation 900 proceeds to operation 910 in which a first portion of a film is deposited based on the first compensation value, in accordance with various embodiments. Continuing with the above example, upon determining the first compensation value, the controller 180 can estimate a first thickness of the first portion (to be formed by the first PVD process) based on a first thickness equation (e.g., $T_1$). Prior to, concurrently with, or subsequently to estimating the first thickness, the controller 180 can adjust or otherwise configure a plural number of first process parameters (e.g., a process time, an operation voltage, a magnetic field, etc.) associated with the first PVD process. After configuring the first process parameters, the controller 180 can apply such parameters to the PVD system 100 for forming the first portion over a substrate. The first portion is formed by physically converting the PVD target from a solid (phase) into a vapor (phase). The vapor of the target material is transported from the PVD target to the substrate, where it is condensed on the substrate as the first portion (again in the solid phase). FIG. 10 illustrates a cross-sectional view of a portion of an example semiconductor device having a substrate 1000 overlaid by a first portion 1010 of a film 1020. In some embodiments, the first PVD process is performed at a lower substrate temperature (when compared to the later second PVD process), and thus, the first portion 1010 can have a smaller grain size (when compared to the later formed second portion).

Figure 11:
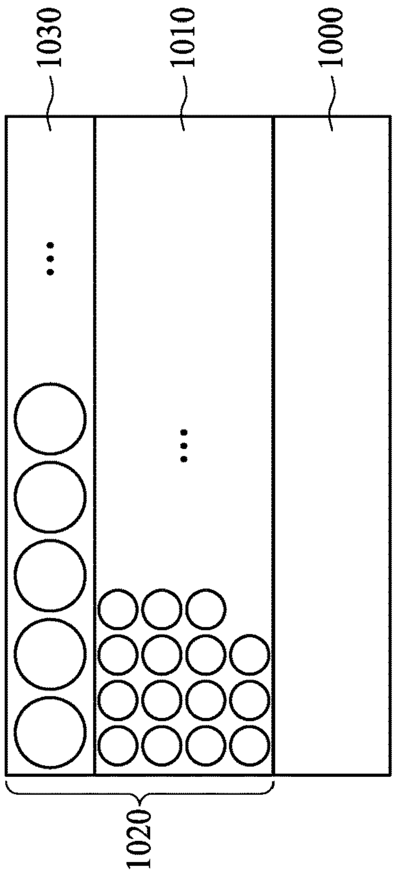
FIG. 11 illustrates a cross-sectional view of the portion of the example semiconductor device having a second portion on the first portion, that is also formed by the PVD system of FIG. 1, in accordance with some embodiments.

The operation 900 proceeds to operation 912 in which a second portion of the film is deposited based on the second compensation value, in accordance with various embodiments. Continuing with the above example, upon determining the second compensation value, the controller 180 can estimate a second thickness of the second portion (to be formed by the second PVD process) based on a second thickness equation (e.g., $T_2$). Prior to, concurrently with, or subsequently to estimating the second thickness, the controller 180 can adjust or otherwise configure a plural number of second process parameters (e.g., a process time, an operation voltage, a magnetic field, etc.) associated with the second PVD process. After configuring the second process parameters, the controller 180 can apply such parameters to the PVD system 100 for forming the second portion over the first portion. The second portion is formed by physically converting the PVD target from a solid (phase) into a vapor (phase). The vapor of the target material is transported from the PVD target to the first portion, where it is condensed on the first portion as the second portion (again in the solid phase). FIG. 11 illustrates a cross-sectional view of the portion of the example semiconductor device having the first portion 1010 overlaid by a second portion 1030 of the film 1020.

Although not illustrated in the method 900, the method 900 may include one or more following polishing processes. In such embodiments, the second portion 1030 (with the larger grain size) may serve as a buffer layer for the polishing process. Stated another way, with the first portion 1010 formed with a thickness about equal to or slightly greater than a target thickness of the final film 1020, the second portion 1030 can be polished out so as to expose the underlying first portion (with the smaller grain size).

In one aspect of the present disclosure, a method for fabricating semiconductor devices is disclosed. The method includes introducing a target in a chamber of a physical vapor deposition (PVD) system. The method includes depositing, on a substrate, a first portion of a film based on a first compensation function, a first value of the first compensation function being determined according to a lifetime of the target. The method includes depositing, on the first portion of the film, a second portion of the film based on a second compensation function, a second value of the second compensation function being determined according to the lifetime of the target. The first value is different from the second value.

In another aspect of the present disclosure, a method for fabricating semiconductor devices is disclosed. The method includes introducing a target in a chamber of a deposition system. The method includes identifying a lifetime of the target. The method includes determining a first value of a first compensation function based on the identified lifetime. The method includes determining a second value of a second compensation function based on the identified lifetime. The method includes transitioning, according to the first value, the target from a first phase to a second phase to deposit a first portion of a film on a substrate. The method includes transitioning, according to the second value, the target from the first phase to the second phase to deposit a second portion of the film on its first portion.

In yet another aspect of the present disclosure, an apparatus for fabricating semiconductor devices is disclosed. The apparatus includes a substrate support configured to place a substrate. The apparatus includes a target holder configured to place a target, with an exposed surface of the target facing the substrate. The apparatus includes a gas source configured to supply a plasma-forming gas, the plasma-forming gas is configured to transition the target from a first phase to a second phase. The apparatus includes a controller configured to determine a first value of a first compensation function according to a lifetime of the target, and a second value of a second compensation function according to the lifetime of the target. A first portion of a film formed on the substrate is formed by depositing the target in the second phase based on the first value, and a second portion of the film formed on the first portion is formed by depositing the target in the second phase based on the second value.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating semiconductor devices, comprising:

introducing a target in a chamber of a physical vapor deposition (PVD) system;

depositing, on a substrate, a first portion of a film based on a first compensation function, a first value of the first compensation function being determined according to a lifetime of the target; and depositing, on the first portion of the film, a second portion of the film based on a second compensation function, a second value of the second compensation function being determined according to the lifetime of the target;

wherein the first value is different from the second value;

wherein a first thickness of the first portion is determined based on a target thickness of the first portion and the lifetime of the target.

2. The method of claim 1, wherein the first compensation function ($Z_1$) is represented as:

$Z_1=ax^2+bx+c$, where "a," "b," and "c" are each an empirical parameter, and "x" corresponds to the lifetime of the target.

3. The method of claim 2, wherein the second compensation function ($Z_2$) is represented as:

$Z_2=dx^2+ex+f$, where "d," "e," and "f" are each an empirical parameter, and "x" corresponds to the lifetime of the target.

4. The method of claim 3, wherein the first thickness of the first portion is determined based on a first thickness function ($T_1$):

$T_1=A(1+Z_1)$, where "A" corresponds to the target thickness of the first portion; and a second thickness of the second portion is determined based on a second thickness function ($T_2$):

$T_2=B(1+Z_2)$, where "B" corresponds to a target thickness of the second portion.

5. The method of claim 4, further comprising:

determining values of the parameters a, b, and c, respectively, causing a plot of the first thickness function versus a plurality of values of the lifetime to be substantially flat; and determining values of the parameters d, e, and f, respectively, causing a plot of the second thickness function versus the plurality of values of the lifetime to be substantially flat.

6. The method of claim 1, further comprising:

supplying a plasma-forming gas into the chamber to sputter the target, while depositing the first portion and the second portion.

7. The method of claim 1, further comprising:

depositing the first portion of the film, in response to identifying that a temperature of the substrate satisfies a first condition; and depositing the second portion of the film, in response to identifying that the temperature of the substrate satisfies a second condition.

8. The method of claim 7, wherein the step of depositing the second portion of the film is performed after the step of depositing the first portion of the film, without a time interval interposed therebetween.

9. The method of claim 7, wherein the step of depositing the second portion of the film is performed after the step of depositing the first portion of the film, with a time interval interposed therebetween.

10. The method of claim 1, wherein the first portion of the film has a first grain size and the second portion of the film has a second grain size, the first grain size being less than the second grain size.

11. The method of claim 10, further comprising performing a polishing process to remove the second portion of the film until the first portion of the film is exposed.

12. A method for fabricating semiconductor devices, comprising:

introducing a target in a chamber of a deposition system;

identifying a lifetime of the target;

determining a first value of a first compensation function based on the identified lifetime;

determining a second value of a second compensation function based on the identified lifetime;

transitioning, according to the first value, the target from a first phase to a second phase to deposit a first portion of a film on a substrate; and transitioning, according to the second value, the target from the first phase to the second phase to deposit a second portion of the film on its first portion;

wherein a first thickness of the first portion decreases as the lifetime of the target increases and a second thickness of the second portion increases as the lifetime of the target increases.

13. The method of claim 12, wherein the first value is different from the second value.

14. The method of claim 12, wherein the first compensation function ($Z_1$) is represented as:

$Z_1=ax^2+bx+c$, where "a," "b," and "c" are each an empirical parameter, and "x" corresponds to the lifetime of the target.

15. The method of claim 14, wherein the second compensation function ($Z_2$) is represented as:

$Z_2=dx^2+ex+f$, where "d" "e," and "f" are each an empirical parameter, and "x" corresponds to the lifetime of the target.

16. The method of claim 15, wherein the first thickness of the first portion is determined based on a first thickness function ($T_1$):

$T_1=A(1+Z_1)$, where "A" corresponds to a target thickness of the first portion; and the second thickness of the second portion is determined based on a second thickness function ($T_2$):

$T_2=B(1+Z_2)$, where "B" corresponds to a target thickness of the second portion.

17. The method of claim 16, further comprising:

determining values of the parameters a, b, and c, respectively, causing a plot of the first thickness function versus a plurality of values of the lifetime to be substantially flat; and determining values of the parameters d, e, and f, respectively, causing a plot of the second thickness function versus the plurality of values of the lifetime to be substantially flat.

18. The method of claim 12, further comprising performing a polishing process to remove the second portion of the film until the first portion of the film is exposed.

19. An apparatus for fabricating semiconductor devices, comprising:

a substrate support configured to place a substrate in a chamber body;

a target holder configured to place a target, with an exposed surface of the target facing the substrate;

a magnet assembly comprising a magnet disposed above the target and an electromagnet disposed around the chamber body;

a gas source configured to supply a plasma-forming gas, wherein the plasma-forming gas is configured to transition the target from a first phase to a second phase; and a controller configured to determine a first value of a first compensation function according to a lifetime of the target, and a second value of a second compensation function according to the lifetime of the target;

wherein a first portion of a film formed on the substrate is formed by depositing the target in the second phase based on the first value, and a second portion of the film formed on the first portion is formed by depositing the target in the second phase based on the second value.

20. The apparatus of claim 19, wherein the first value is different from the second value.

* * * * *